(12) United States Patent
Bierhuizen

(10) Patent No.: US 8,269,235 B2
(45) Date of Patent: Sep. 18, 2012

(54) LIGHTING SYSTEM INCLUDING COLLIMATORS ALIGNED WITH LIGHT EMITTING SEGMENTS

(75) Inventor: Serge J. Bierhuizen, Santa Rosa, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 166 days.

(21) Appl. No.: 12/767,513

(22) Filed: Apr. 26, 2010

(65) Prior Publication Data

US 2011/0260178 A1 Oct. 27, 2011

(51) Int. Cl.
*H01L 33/00* (2010.01)

(52) U.S. Cl. .............. 257/94; 257/98; 257/99

(58) Field of Classification Search .......... 257/94, 257/99, 88, E33.072, E33.001
See application file for complete search history.

(56) References Cited

U.S. PATENT DOCUMENTS

| | | | |
|---|---|---|---|
| 6,547,249 B2 | 4/2003 | Collins, III et al. | |
| 7,352,011 B2 | 4/2008 | Smits et al. | |
| 7,361,938 B2 | 4/2008 | Mueller et al. | |
| 2002/0074522 A1 | 6/2002 | Zakar | |
| 2004/0263346 A1 | 12/2004 | Neal | |
| 2006/0091784 A1* | 5/2006 | Conner et al. | 313/498 |
| 2007/0072324 A1 | 3/2007 | Krames et al. | |
| 2007/0176192 A1* | 8/2007 | Leatherdale et al. | 257/98 |
| 2008/0153192 A1 | 6/2008 | Grillot et al. | |
| 2010/0188837 A1* | 7/2010 | Van Bommel et al. | 362/84 |

FOREIGN PATENT DOCUMENTS

| | | |
|---|---|---|
| DE | 102008030819 A1 | 12/2009 |
| EP | 2042801 A1 | 4/2009 |
| WO | 2004032235 A2 | 4/2004 |
| WO | 2006016326 A2 | 2/2006 |
| WO | 2006089508 A1 | 8/2006 |
| WO | 2008109296 A1 | 9/2008 |

OTHER PUBLICATIONS

U.S. Appl. No. 12/709,655, filed Feb. 22, 2010; Inventor: Jeffrey D. Kmetec; Confirmation Number: 7162, Entitled: Adaptive Lighting System With III-Nitride Light Emitting Devices. pp. 13. Applicants: Philips Lumiled Lighting Company, LLC & Koninklijke Philips Electronics N.V.

* cited by examiner

*Primary Examiner* — Michael Shingleton

(57) ABSTRACT

A light source comprising a semiconductor light emitting device is connected to a mount. The light emitting device comprises a plurality of segments with neighboring segments spaced less than 200 microns apart. In some embodiments, multiple segments are grown on a single growth substrate. Each segment comprises a light emitting layer disposed between an n-type region and a p-type region. A spacer is positioned on a top surface of the mount. The light emitting device is positioned in an opening in the spacer. A plurality of collimators is attached to the spacer, wherein each collimator is aligned with a single segment.

20 Claims, 4 Drawing Sheets

US 8,269,235 B2

LIGHTING SYSTEM INCLUDING COLLIMATORS ALIGNED WITH LIGHT EMITTING SEGMENTS

BACKGROUND

1. Field of Invention

The present invention relates to a lighting system including collimators aligned with light emitting segments.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

An adaptive lighting system is a system where the beam pattern projected is selectively altered. For example, in an adaptive lighting system for an automotive headlight, the beam pattern projected anticipates the direction of the automobile and selectively alters the beam pattern to produce light in that direction.

US 2004/0263346, which is incorporated herein by reference, describes the solid state adaptive forward lighting system shown in FIG. 1. The system of FIG. 1 includes an array 42 of light emitting diodes ("LEDs") 43. Each row of the array 42 is electrically connected to a horizontal LED driver 36, and each column of the array 42 is electrically connected to a vertical LED driver 34. The horizontal and vertical drivers 36 and 34 are attached to a central processing unit 28. A wheel angle sensor 20 and an incline sensor 24 are both attached to the central processing unit 28. A converging lens (not shown in FIG. 1) is positioned in front of the array 42. Upon receiving signals from the wheel angle sensor 20 and the incline sensor 24, the central processing unit 28 communicates with the horizontal and vertical LED drivers 36 and 34, to illuminate selected LEDs 43 in the array 42. Light rays from the LEDs 43 are angled by the lens, such that the selective illumination of one or more of the LEDs 43 in the array 42 allows the headlamp to project light in variable horizontal and vertical directions. Horizontal and vertical lines connected to each LED in the array terminate into a horizontal bus 38 and a vertical bus 40, respectively. The horizontal bus 38 is in electrical communication with the horizontal LED driver 36, and the vertical bus 40 is in electrical communication with the vertical LED driver 34. Each of the horizontal lines 60 and vertical lines 62 terminates in an associated switch, which is operable by the horizontal LED driver 36 and the vertical LED driver 34, respectively.

SUMMARY

It is an object of the invention to provide a compact light source comprising a plurality of light emitting segments and a collimator associated with each segment.

In embodiments of the invention, a light source comprising a semiconductor light emitting device is connected to a mount. The light emitting device comprises a plurality of segments with neighboring segments spaced less than 200 microns apart. In some embodiments, multiple segments are grown on a single growth substrate. Each segment comprises a light emitting layer disposed between an n-type region and a p-type region. A spacer is positioned on a top surface of the mount. The light emitting device is positioned in an opening in the spacer. A plurality of collimators is attached to the spacer, wherein each collimator is aligned with a single segment.

DETAILED DESCRIPTION

Figure 1:
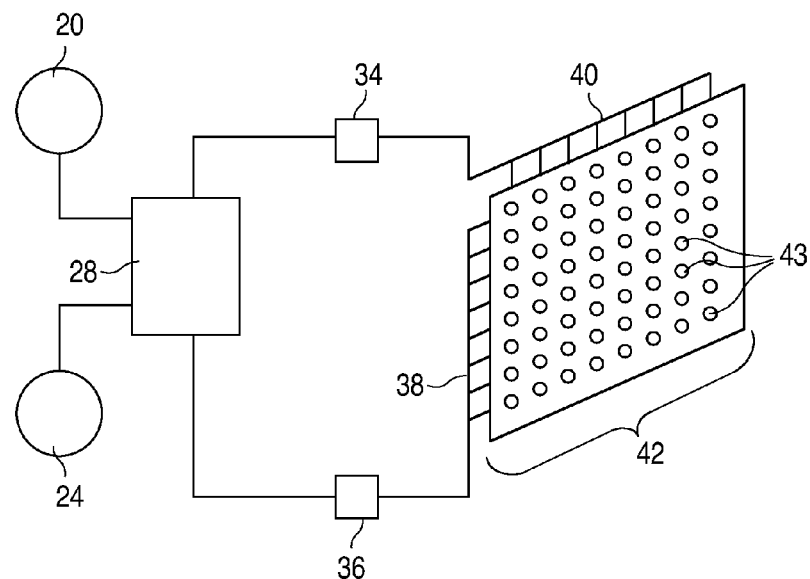
FIG. 1 illustrates a prior art adaptive forward lighting system.

In the system illustrated in FIG. 1, individual LEDs are used. Each individual LED may include a package and an imaging optic such as a lens. Accordingly, the system illustrated in FIG. 1 may be expensive to produce and may be undesirably large due to the spacing required for the packages and imaging optics for each LED.

In embodiments of the invention, a light source includes one or more LEDs divided into segments which may be individually addressable. The light source may be used for an adaptive lighting system such as an automotive headlamp, and may be less expensive and more compact than the light source illustrated in FIG. 1. Though the examples below refer to III-nitride LEDs, other semiconductor light emitting devices may be used, including other III-V devices such as III-phosphide or III-arsenide LEDs, II-VI devices, or Si-based devices.

Figure 3:
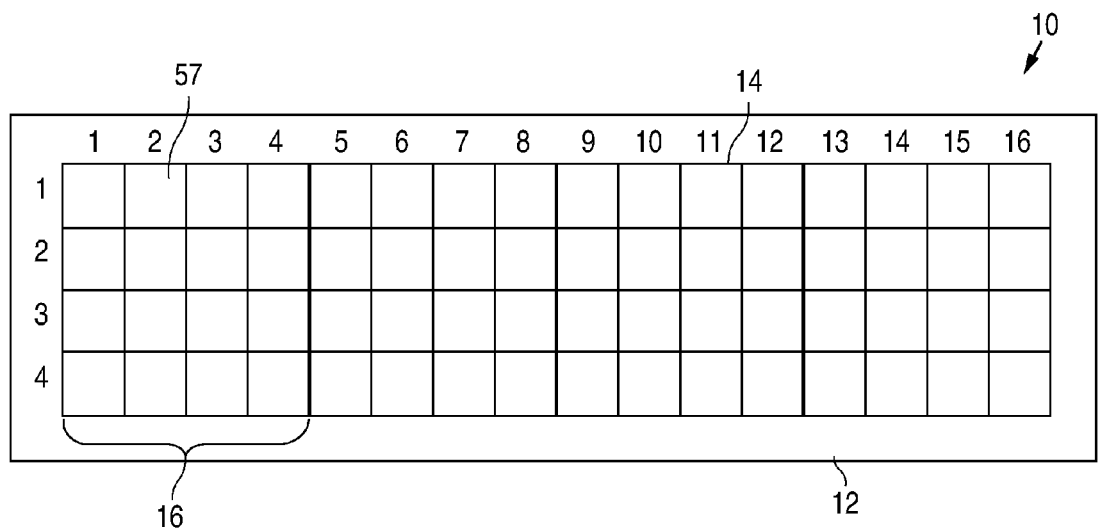
FIG. 3 is a top view of an array of III-nitride light emitting device segments.

FIG. 3 is a top view of a light source 10 according to embodiments of the invention. An array of LEDs 14 is attached to a mount 12. Four LEDs 16 are illustrated. Each LED 16 is divided into multiple segments 57. Each LED illustrated in FIG. 3 is divided into a 4×4 array of segments, for a total of 16 segments per LED and 64 segments total. For example, each LED 16 may be about 1 mm by 1 mm in area, and each segment may be about 250 microns by 250 microns. The LEDs and segments need not be square as illustrated in FIG. 3; they may be rectangular, parallelogram, rhomboid, or any combination of shapes. More or fewer than four LEDs may be used, and each LED may be divided into more or fewer than 16 segments. In addition, the LEDs need not be symmetrical. For example, some LEDs may be divided into fewer and/or larger segments. For example, some or all of the LEDs may be divided into 1×2, 2×2, 2×3, 2×5, 3×6, or 5×6 segments. In some embodiments, light source 10 may include between 30 and 100 segments. The size of each segment is selected to match the desired total area of the LED, and the total number of desired elements. In some embodiments, the total required area for an LED headlamp is between 4 and 24 mm$^2$. Accordingly, segment size may range from 1 to 0.5 mm$^2$ down to 0.04 mm$^2$. In some embodiments, a 2×2 array of segments is preferred, because it permits the use of collimators with two straight sidewalls and two angled sidewalls, as shown in cross section in FIGS. 4 and 6.

Figure 2:
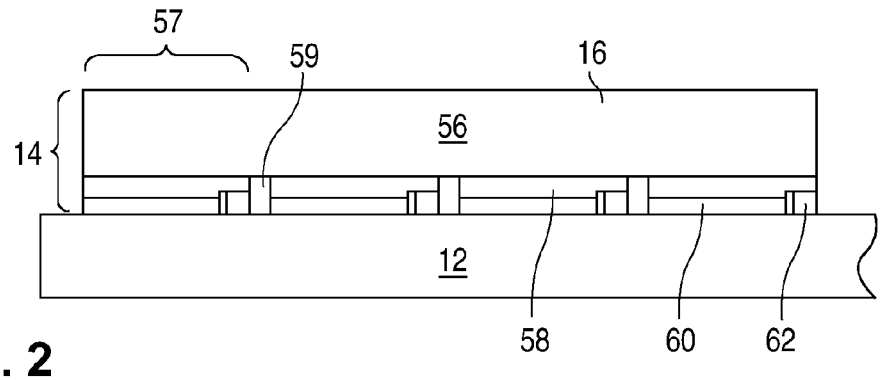
FIG. 2 is a simplified side view of a single III-nitride light emitting device divided into segments.

FIG. 2 is a simplified side view of a single LED 16 divided into segments 57. Four segments 57 are illustrated in FIG. 2. The LED is represented by number 14 in FIG. 2, and a portion of mount 12 is illustrated. Though FIG. 2 illustrates a thin film flip chip device, other types of devices may be used, such as vertical devices, where the n- and p-contacts are formed on opposite sides of the device, a device where both contacts are formed on the same side of the device and light is extracted through the contacts, or a flip chip device in which the growth substrate remains a part of the device.

Each LED segment 57 includes semiconductor layers 58, which include an n-type region, a light emitting or active region, and a p-type region. Semiconductor layers 58 may be grown on a growth substrate such as, for example, sapphire, SiC, GaN, Si, one of the strain-reducing templates grown over a growth substrate such as sapphire described in US 2008/0153192, which is incorporated herein by reference, or a composite substrate such as, for example, an InGaN seed layer bonded to a sapphire host, as described in US 2007/0072324, which is incorporated herein by reference.

The n-type region is typically grown first and may include multiple layers of different compositions and dopant concentration including, for example, preparation layers such as buffer layers or nucleation layers, which may be n-type or not intentionally doped, release layers designed to facilitate later release of the composite substrate or thinning of the semiconductor structure after substrate removal, and n- or even p-type device layers designed for particular optical or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick quantum well light emitting layers separated by barrier layers. A p-type region is grown over the light emitting region. Like the n-type region, the p-type region may include multiple layers of different composition, thickness, and dopant concentration, including layers that are not intentionally doped, or n-type layers.

A p-contact 60 is formed on the top surface of p-type region. P-contact 60 may include a reflective layer, such as silver. P-contact 60 may include other optional layers, such as an ohmic contact layer and a guard sheet including, for example, titanium and/or tungsten. On each segment 57, a portion of p-contact 60, the p-type region, and the active region is removed to expose a portion of the n-type region on which an n-contact 62 is formed. U.S. application Ser. No. 12/236,853, which is incorporated herein by reference, describes forming contacts on an LED divided into segments grown on the seed layer of a composite substrate formed in islands.

Trenches 59, which extend through an entire thickness of the semiconductor material, are formed between each segment 57 to electrically isolate adjacent segments. Trenches 59 may be filled with a dielectric material such as an oxide of silicon or a nitride of silicon formed by plasma enhanced chemical vapor deposition. Isolation means besides trenches, such as implantation of semiconductor material to cause a region between segments to be insulating, may be used.

Interconnects (not shown in FIG. 2) are formed on the p- and n-contacts and/or the mount, then the device is connected to mount 12 through the interconnects. Mount 12 may be any suitable material, including, for example, silicon, ceramic, AlN, and alumina. The interconnects may be any suitable material, such as solder or other metals, and may include multiple layers of materials. In some embodiments, interconnects include at least one gold layer and the bond between the LED segments and the mount is formed by ultrasonic bonding. During ultrasonic bonding, the LED die is positioned on a mount. A bond head is positioned on the top surface of the LED die, for example on the top surface of the growth substrate. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED, such as the n- and p-contacts or interconnects formed on the n- and p-contacts, to interdiffuse with a structure on the mount, resulting in a metallurgically continuous joint. Heat and/or pressure may be added during bonding.

After the semiconductor structure is bonded to mount 12, all or part of the growth substrate may be removed. For example, a sapphire growth substrate or a sapphire host substrate that is part of a composite substrate may be removed by laser melting of a III-nitride or other layer at an interface with the sapphire substrate. Other techniques such as etching or mechanical techniques such as grinding may be used as appropriate to the substrate being removed. After the growth substrate is removed, the semiconductor structure may be thinned, for example by photoelectrochemical (PEC) etching. The exposed surface of the n-type region may be textured, for example by roughening or by forming a photonic crystal.

One or more wavelength converting materials 56 may be disposed over the semiconductor structure. The wavelength converting material(s) may be, for example, one or more powder phosphors disposed in a transparent material such as silicone or epoxy and deposited on the LED by screen printing or stenciling, one or more powder phosphors formed by electrophoretic deposition, spraying, sedimenting, evaporation, or sputtering, or one or more ceramic phosphors glued or bonded to the LED, one or more dyes, or any combination of the above-described wavelength converting layers. Ceramic phosphors, also referred to as luminescent ceramics, are described in more detail in U.S. Pat. No. 7,361,938, which is incorporated herein by reference. The wavelength converting materials may be formed such that a portion of light emitted by the light emitting region is unconverted by the wavelength converting material. In some examples, the unconverted light is blue and the converted light is yellow, green, and/or red, such that the combination of unconverted and converted light emitted from the device appears white. Wavelength converting materials 56 may be individually formed on each segment 57, on each LED 16, or on the entire array 14.

Mount 12 is formed such that segments 57 can be independently activated. For example, mount 12 may be a ceramic wiring substrate or a silicon integrated circuit formed by conventional processing steps. Some segments may always be activated together, and may be connected for example in series or in parallel. Interconnects connecting such segments may be formed on or within mount 12 or on the LED array 14, as described, for example, in U.S. Pat. No. 6,547,249, which is incorporated herein by reference.

In some embodiments, neighboring segments are closely spaced on a single mount but need not be grown on the same substrate. For example, neighboring segments may be spaced less than 200 microns apart in some embodiments, less than 100 microns apart in some embodiments, less than 50 microns apart in some embodiments, less than 25 microns apart in some embodiments, less than 10 microns apart in some embodiments, and less than 5 microns apart in some embodiments. Other examples of light sources including light emitting segments are described in U.S. application Ser. No. 12/709,655, titled "Adaptive Lighting System With III-Nitride Light Emitting Devices" and incorporated herein by reference.

Figure 7:
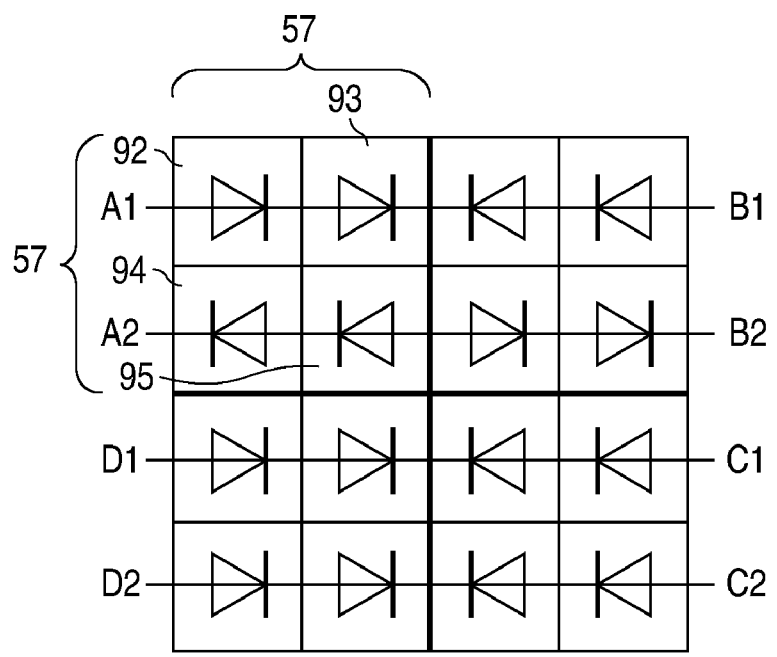
FIG. 7 illustrates a device with four segments. Each segment is divided into four junctions.
Figure 8:
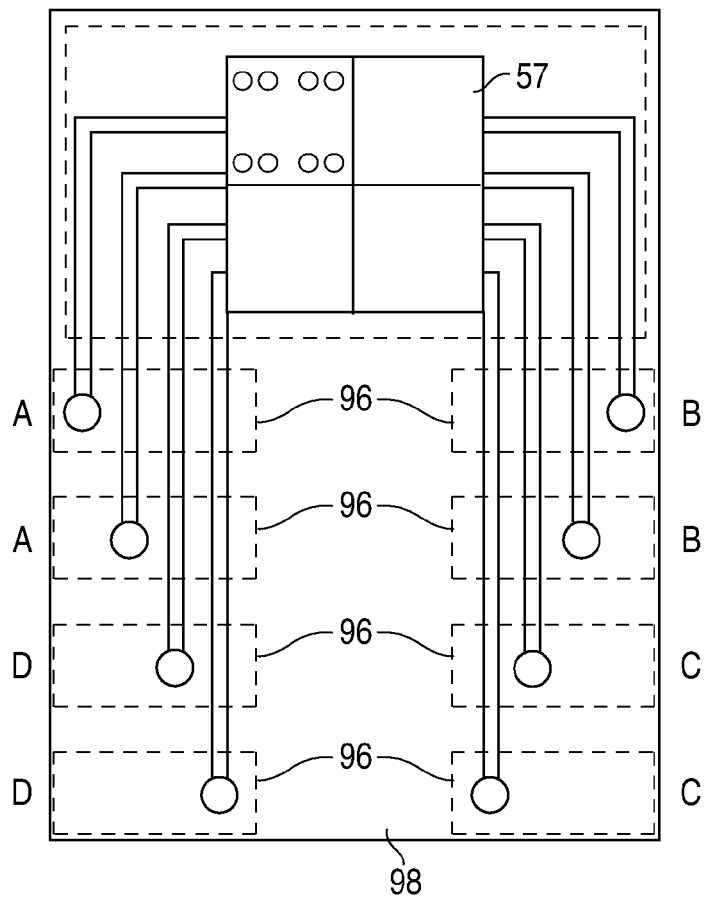
FIG. 8 illustrates the device of FIG. 7 connected to a mount.

In some embodiments, a single segment is divided into multiple junctions. At least two of the junctions may be independently addressed. All the junctions in a segment may be activated when bright light is required. Fewer than all the junctions in a segment may be activated when dimmer light is required. FIG. 7 illustrates a device with four segments 57. Each segment is separated into four junctions. The four junctions in the top left segment 57 are labeled 92, 93, 94, and 95 in FIG. 7. FIG. 8 illustrates a top view of a mount 98 on which the device of FIG. 7 is mounted. Interconnects between the junctions may be formed on the mount or on the device as described above. In the device illustrated in FIGS. 7 and 8, the top two junctions 92 and 93 in each segment are connected in series and activated together. The bottom two junctions 94 and 95 in each segment are also connected in series and activated together. For each segment 57, all, half, or none of the junctions may be activated at a given time by supplying current to the appropriate pad 96 on mount 98.

One challenge for light sources involving individually addressable LED segments is imaging optics for a given lighting application often accept light only in a limited angular cone. III-nitride LEDs often emit light in a lambertian cone at angles ±90° relative to a normal to the top surface of the LED. An F#2 optic, for example, accepts a cone of ±14.5° and an F#1 optic accepts a cone of ±30°. These optics are able to use only 6% and 25%, respectively, of the light emitted from a segmented LED that emits light into a lambertian cone, which may reduce the efficiency of a source with segmented LEDs as compared to a source with individual packaged LEDs, where the light may be collimated into a narrow angular cone by a collimating optic associated with each LED.

In embodiments of the invention, one or more segmented LEDs are combined with individual collimators for each segment. The collimators are attached to a spacer, which controls the spacing between each LED segment and the collimator, and aligns the collimators with the segments. The collimators reduce the angular cone of light emitted by each segment so the light may be efficiently used by imaging optics.

Figure 4:
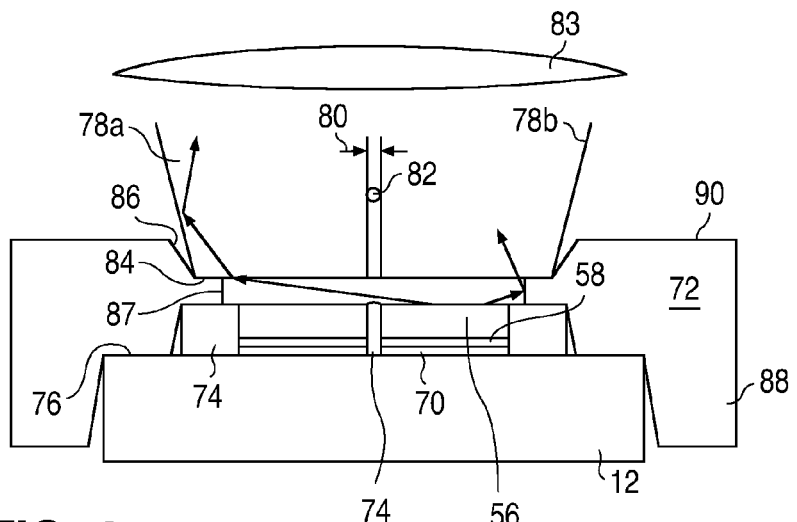
FIG. 4 is a cross sectional view of a segmented light emitting device, a spacer, a reflective side coating, and collimators aligned with each segment.

FIG. 4 is a cross sectional view of a segmented LED, a spacer, and individual collimators. Two segments and two collimators 78a and 78b are illustrated. The segments illustrated include a wavelength converting layer 56 disposed over semiconductor layers 58. The segments are connected to a mount 12 by interconnects 70.

Figure 5:
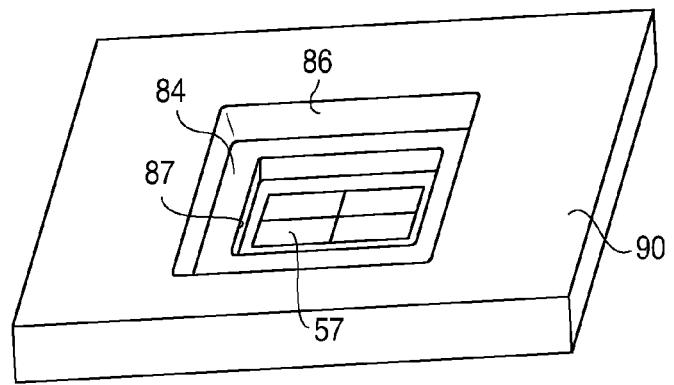
FIG. 5 illustrates one example of a spacer.

A spacer 72 is positioned around the segmented LED. FIG. 5 illustrates one example of a spacer. An LED with four segments 57 is illustrated in FIG. 5. The segmented LED is aligned with an opening in the spacer. The size of the opening in the spacer controls the source dimension of light entering collimators 78a and 78b. The sidewalls 87 of spacer 72 are generally reflective, to direct light into collimators 78a and 78b. Spacer 72 may be formed from any suitable material, including, for example, reflective white materials such as PPA and PCT, hard silicone including a reflective material such as $TiO_2$, or white reflective ceramics.

To accurately control the distance between the bottom of collimators 78a and 78b and the top of the LED segments, i.e. the height of sidewall 87 in the spacer illustrated in FIG. 4, the spacer may be connected to a top surface of mount 12. For example, spacer 72 may be glued to mount 12 on the edges 76 of mount 12, or molded over mount 12 and the segmented LED. Overmolding is described in more detail in U.S. Pat. No. 7,352,011, which is incorporated herein by reference. The spacing between the bottom of collimators 78a and 78b and the top of the LED segments may be between 10 microns and 100 microns in some embodiments, between 40 microns and 60 microns in some embodiments, and less than 50 microns in some embodiments. Accurately controlling the distance between the bottom of collimators 78a and 78b and the top of the LED segments may improve the efficiency of the device by reducing crosstalk between neighboring segments.

Spacer 72 may include a portion 88 that extends over the side of mount 12, as illustrated in FIG. 4, though it need not. A side surface of portion 88 may attach spacer 72 to a side surface of mount 12, for example by overmolding or gluing.

In some embodiments, an optional side coating 74 is disposed on the sides of semiconductor layers 58, wavelength converting layer 56, or both. Side coating may be reflective, to prevent or reduce the amount of light escaping through the sides of semiconductor layers 58 and wavelength converting layer 56. Side coating may be a reflective coating that is painted or otherwise disposed on the side surfaces of semiconductor layers 58 and wavelength converting layer 56, or a structure formed from, for example, reflective white materials such as PPA and PCT, hard silicone including a reflective material such as $TiO_2$, or white reflective ceramics. In some embodiments, side coating 74 is used to accurately control the distance between the bottom of collimators 78a and 78b and the top of the LED segments, i.e. the height of sidewall 87. For example, spacer 72 may use side coating 74 as a reference by resting on or contacting side coating 74, as illustrated in FIG. 4. In some embodiments, spacer 72 is attached to side coating 74, for example by overmolding or gluing, in addition to or instead of attachments formed between mount 12 and spacer 72.

Figure 6:
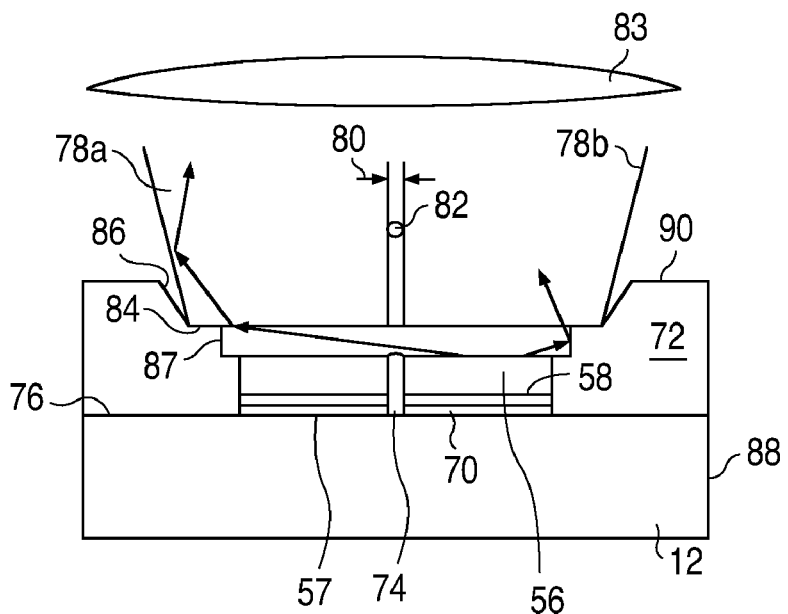
FIG. 6 is a cross sectional view of a segmented light emitting device, a spacer, and collimators aligned with each segment.

In the device illustrated in FIG. 6, side coating 74 is omitted. Spacer 72 of FIG. 6 may be, for example, silicone molded over the segments attached to mount 12.

Collimators 78a and 78b may be hollow with reflective sidewalls, or a dielectric material which relies on total internal reflection for reflectivity. A collimator is aligned with each segment 57 of the LED. Neighboring collimators may be spaced apart from each other by a distance 80. The spacing between neighboring collimators may be maintained by a spacing element 82, which may be, for example, a ball or wire of the desired diameter. Neighboring collimators may be spaced between 1 and 200 microns apart in some embodiments and between 5 and 50 microns apart in some embodiments. In order to align the collimators with the LED segments, collimators 78a and 78b may be disposed in a recess 86 extending below the top surface 90 of spacer 72. Collimators 78a and 78b may be attached to spacer 72, for example by an adhesive layer positioned at the edge 84 of the opening in the spacer 72. In embodiments where collimators 78 are a solid material, an adhesive at edge 84, which would normally be absorbing to light, does not absorb light, because the shape of spacer 72 prevents light from reaching edge 84, as illustrated by the rays shown in FIGS. 4 and 6.

Figure 9:
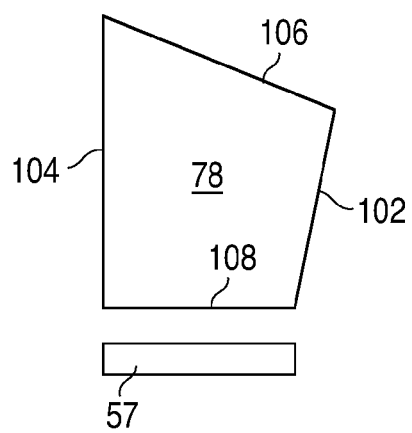
FIG. 9 illustrates a collimator.

The output face of a solid collimator 78 may be slanted relative to the face of the segment 57, as illustrated in FIG. 9. Collimator 78 has a straight wall 104, which is perpendicular to the top face of segment 57 and which is often proximate to the straight sidewall of an adjacent collimator associated with another segment. Collimator 78 also has a slanted sidewall 102 which is disposed at an acute angle relative to a plane that is perpendicular to the top surface of segment 57. Input face 108 is parallel to the top face of segment 57. Output face 106 may be slanted such that it is not parallel to input face 108 or the top face of segment 57. For example, output face 106 may be angled such that straight wall 104 is longer than slanted wall 102, as illustrated in FIG. 9. Shaping the output face in this way may at least partially compensate for any skew in light output caused by the asymmetry of collimator 78.

Individual collimators for each LED segment according to embodiments of the invention direct light from each segment into an angular cone that is sufficiently narrow for the imaging optics 83 of the application. Light emitted by each segment at large angles may be directed into the collimator rather than lost, which may improve the efficiency of the light source. Reducing the angular cone emitted by each segment may reduce crosstalk between neighboring segments, which may improve the accuracy of imaging of a device using a light source according to embodiments of the invention. Attaching the collimators to a spacer that is connected to the top surface of a mount may improve the efficiency of the device by accurately controlling the distance between the bottom of each collimator and the top of each LED segment.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
   a light source comprising a light emitting device connected to a mount, the light emitting device comprising a plurality of segments wherein neighboring segments are spaced less than 200 microns apart, each segment comprising a light emitting layer disposed between an n-type region and a p-type region;
   a spacer positioned on a top surface of the mount, wherein the light emitting device is positioned in an opening in the spacer; and
   a plurality of collimators attached to the spacer, wherein each collimator is aligned with a single segment.

2. The structure of claim 1 wherein the mount is configured such that at least two segments may be independently activated.

3. The structure of claim 1 wherein a bottom surface of each collimator is spaced apart from a top surface of the segment corresponding to each collimator.

4. The structure of claim 3 wherein the top surface of at least one segment is a top surface of a wavelength converting element disposed over the III-nitride light emitting layer.

5. The structure of claim 3 wherein a space between the bottom surface of each collimator and the top surface of the segment corresponding to each collimator is less than 50 microns.

6. The structure of claim 1 wherein the spacer is attached to the top surface of the mount by an adhesive.

7. The structure of claim 1 wherein the spacer comprises silicone molded over a top surface of the mount.

8. The structure of claim 1 wherein neighboring collimators are spaced apart from each other.

9. The structure of claim 1 wherein neighboring collimators are spaced apart from each other by one of a ball and a wire.

10. The structure of claim 1 wherein at least two segments are grown on a single growth substrate.

11. The structure of claim 1 further comprising a reflective surface disposed adjacent a sidewall of the light emitting device.

12. The structure of claim 11 wherein the spacer is attached to the reflective surface.

13. The structure of claim 1 further comprising an optic, wherein the collimators are disposed between the optic and the light source.

14. The structure of claim 1 wherein the light emitting layer is a III-nitride layer.

15. The structure of claim 1 wherein at least one segment is divided into a plurality of junctions, wherein the mount is configured such that least two junctions in the plurality may be independently activated.

16. The structure of claim 1 wherein at least one collimator comprises:
   a first sidewall that is perpendicular to a top face of a segment; and
   a second sidewall that is angled at an acute angle relative to a plane perpendicular to a top face of the segment.

17. The structure of claim 16 wherein the at least one collimator further comprises:
   an input face proximate to the top face of the segment; and
   an output face opposite the input face, wherein the output face is not parallel to the input face.

18. A method comprising:
   spacing a top surface of a light source a predetermined distance from a bottom surface of a plurality of collimators;
   wherein:
      the light source comprises a light emitting device connected to a mount, the light emitting device comprising a plurality of segments wherein neighboring segments are spaced less than 200 microns apart, each segment comprising a light emitting layer disposed between an n-type region and a p-type region;
      each collimator in the plurality of collimators is aligned with a single segment;
      the plurality of collimators are attached to a spacer positioned on a top surface of the mount; and
      the light emitting device is positioned in an opening in the spacer.

19. The method of claim 18 wherein spacing a top surface of the light source a predetermined distance from a bottom surface of the plurality of collimators comprises registering a surface on the spacer with a top surface of the mount.

20. The method of claim 18 wherein spacing a top surface of the light source a predetermined distance from a bottom surface of the plurality of collimators comprises registering a surface on the spacer with a top surface of a reflective structure disposed adjacent a sidewall of the light emitting device.

* * * * *